United States Patent
Kihara et al.

(10) Patent No.: US 9,397,563 B2
(45) Date of Patent: Jul. 19, 2016

(54) DRIVER CIRCUIT

(71) Applicant: Sharp Kabushiki Kaisha, Osaka-shi, Osaka (JP)

(72) Inventors: Seiichiro Kihara, Osaka (JP); Akio Nakajima, Osaka (JP)

(73) Assignee: SHARP KABUSHIKI KAISHA, Osaka (JP)

(*) Notice: Subject to any disclaimer, the term of this patent is extended or adjusted under 35 U.S.C. 154(b) by 3 days.

(21) Appl. No.: 14/374,927

(22) PCT Filed: Dec. 17, 2012

(86) PCT No.: PCT/JP2012/082638
§ 371 (c)(1),
(2) Date: Jul. 28, 2014

(87) PCT Pub. No.: WO2013/114746
PCT Pub. Date: Aug. 8, 2013

(65) Prior Publication Data
US 2014/0375292 A1 Dec. 25, 2014

(30) Foreign Application Priority Data
Jan. 30, 2012 (JP) .................. 2012-016493

(51) Int. Cl.
*G05F 1/575* (2006.01)
*H02M 3/157* (2006.01)
(Continued)

(52) U.S. Cl.
CPC .............. *H02M 3/157* (2013.01); *H02M 1/08* (2013.01); *H03K 17/063* (2013.01)

(58) Field of Classification Search
CPC ..... H02M 7/538; H02M 1/38; H02M 3/1588; H03K 17/6871; H03K 17/063

USPC ......... 323/222, 224, 235, 271–273, 282–290; 363/16, 17, 87, 89, 97, 98, 131; 327/108, 111
See application file for complete search history.

(56) References Cited

U.S. PATENT DOCUMENTS 5,365,118 A * 11/1994 Wilcox ................... H02M 1/38
    327/109
5,666,280 A * 9/1997 Janaswamy ............. H02M 7/03
    363/17

(Continued)

FOREIGN PATENT DOCUMENTS

| JP | 2006-314154 A | 11/2006 |
| JP | 2007-288992 A | 11/2007 |

(Continued)

OTHER PUBLICATIONS

Palma et al. "Buffer Interface with Negative Gate Bias for Desat Protected HVICs used in High Power Applications", International Rectifier, Application Note AN-1120, pp. 1-12.

*Primary Examiner* — Rajnikant Patel
(74) *Attorney, Agent, or Firm* — Birch, Stewart, Kolasch & Birch, LLP

(57) ABSTRACT

A driver circuit includes normally-on first and second transistors, a first control circuit for controlling the first transistor in response to a first control signal, a second control circuit for controlling the second transistor in response to a second control signal, a capacitor connected between first and second power supply nodes of the first control circuit, a power supply connected between third and fourth power supply nodes of the second control circuit, a switch element connected between first and fourth power supply nodes, and a third control circuit for turning the switch element on when an output voltage becomes about 0V.

12 Claims, 7 Drawing Sheets

(51) Int. Cl.
   *H02M 1/08*      (2006.01)
   *H03K 17/06*     (2006.01)

(56) References Cited

U.S. PATENT DOCUMENTS

| | | | | |
|---|---|---|---|---|
| 5,963,066 A | * | 10/1999 | Fukunaga | H02M 7/538 323/224 |
| 6,211,706 B1 | * | 4/2001 | Choi | H03K 17/063 327/108 |
| 7,215,189 B2 | * | 5/2007 | Wilhelm | H03K 17/6871 323/282 |
| 7,952,339 B2 | * | 5/2011 | Sakamoto | H02M 3/07 323/284 |
| 8,416,015 B2 | * | 4/2013 | Tsuchiya | H03K 17/302 327/494 |
| 2006/0034107 A1 | | 2/2006 | West | |
| 2007/0216469 A1 | | 9/2007 | Sakamoto | |
| 2013/0200926 A1 | | 8/2013 | Kihara et al. | |

FOREIGN PATENT DOCUMENTS

| | | |
|---|---|---|
| JP | 2010-35389 A | 2/2010 |
| JP | 2011-66963 A | 3/2011 |
| JP | 2012-110205 A | 6/2012 |

* cited by examiner

DRIVER CIRCUIT

TECHNICAL FIELD

The present invention relates to driver circuits, and more particularly to a driver circuit which includes a normally-on transistor having a negative threshold voltage or a normally-off transistor having a low threshold voltage of about 2V as a switching element, and which is used in an inverter circuit, for example.

BACKGROUND ART

An element made of a wide band gap semiconductor as typified by GaN, SiC and so on has excellent characteristics such as high-speed switching and a low ON resistance value as compared to an element made of a silicon semiconductor. On the other hand, the element made of a wide band gap semiconductor exhibits a normally-on characteristic in which a drain current flows therethrough even when a gate voltage is 0V, or a normally-off characteristic with a low threshold voltage of about 2V. Thus, the gate voltage needs to be driven to a negative voltage in order to ensure that this element is turned off.

Japanese Patent Laying-Open No. 2007-288992 (PTD 1) describes a semiconductor circuit for switching elements having a normally-on characteristic or switching elements having a normally-off characteristic with a low threshold voltage.

In PTD 1, a power supply circuit for generating a negative voltage to be supplied to a high side (high-voltage side) switching element and a power supply circuit for generating a negative voltage to be supplied to a low side (low-voltage side) switching element are provided, with a high-voltage side of the high side power supply circuit being connected to a positive terminal of a high-voltage power supply. Also provided is a control capacitor having one electrode connected to a low-voltage (negative voltage) side of the high side power supply circuit. A control circuit for controlling on/off of the switching elements is provided with an operation power supply from the control capacitor which is charged when the switching elements are on. As an example of the power supply circuit, a configuration is described in which a current flows to a capacitor through another switching element, and a Zener diode is connected in parallel to the capacitor to form a negative voltage power supply.

Japanese Patent Laying-Open No. 2006-314154 (PTD 2) discloses a power converter for supplying a negative voltage to a normally-on switching element on a high side by using a constant voltage diode (Zener diode).

International Rectifier Japan Application Note AN-1120 (NPD 1) describes a buffer circuit driven with a negative gate-bias voltage.

CITATION LIST

Patent Documents

PTD 1: Japanese Patent Laying-Open No. 2007-288992
PTD 2: Japanese Patent Laying-Open No. 2006-314154

Non Patent Document

NPD 1: International Rectifier Japan Application Note AN-1120

SUMMARY OF INVENTION

Technical Problem

When supplying a negative voltage from a low side circuit to a high side circuit, a bootstrap circuit consisting of a diode and a capacitor used in a gate driver circuit for inverter cannot be used due to the polarity problem of the diode. Thus, it is stated in NPD 1 that an insulated power supply is needed on the high side.

In PTD 1, since the internal power supply circuit on the high side is configured such that its high-voltage side is connected to the positive terminal of the high-voltage power supply, as described above, a current may flow in from the high-voltage power supply to cause a short circuit. Thus, the power supply needs to be insulated in order to prevent the short circuit. In addition, the power supply is needed for each of the high side and the low side.

Furthermore, while the high side power supply is realized by using the switching element, the capacitor and the Zener diode in PTD 1, it is difficult to manufacture a Zener diode having a high breakdown voltage, resulting in a limited a range of power supply voltage.

Likewise, the constant voltage diode (Zener diode) used in PTD 2 has a limited range of available power supply voltage due to the limitation of breakdown voltage.

Usually, in an inverter circuit, an FWD (free wheel diode) having a low backward recovery current needs to be connected in parallel to a switching element in order to suppress a reverse power loss and noise. Among normally-on transistors, although a lateral device performing unipolar operation has a reverse conducting function in itself, the absolute value of a reverse conduction rising voltage increases depending on a low gate voltage (usually not more than −10V) in an off state. Thus, an FWD needs to be connected in parallel in a similar manner.

These problems have caused an increased cost due to increase in size and complexity of a driver circuit, thereby preventing the proliferation of a driver circuit made of a wide band gap semiconductor.

Accordingly, a main object of the present invention is to provide a driver circuit having a small size and a simple configuration.

Solution to Problem

A driver circuit according to the present invention includes a first transistor connected between a line of a first voltage and an output terminal, a second transistor connected between the output terminal and a line of a second voltage lower than the first voltage, a first control circuit including first and second power supply nodes, for supplying a voltage of the first power supply node to a control electrode of the first transistor to turn the first transistor on in response to setting of an input signal to a first logic level, and for supplying a voltage of the second power supply node to the control electrode of the first transistor to turn the first transistor off in response to setting of the input signal to a second logic level, and a second control circuit including third and fourth power supply nodes, for supplying a voltage of the fourth power supply node to a control electrode of the second transistor to turn the second transistor off in response to setting of the input signal to the first logic level, and for supplying a voltage of the third power supply node to the control electrode of the second transistor to turn the second transistor on in response to setting of the input signal to the second logic level. The first power supply node is connected to the output terminal, the third power supply node receives the second voltage, and the fourth power supply node receives a third voltage lower than the second voltage. The driver circuit further includes a capacitor connected between the first and second power supply nodes, a switch element connected between the second and fourth power supply nodes, and a third control circuit for turning the switch element on to charge the capacitor in response to a decrease in a voltage corresponding to a difference between a voltage of the output terminal and the second voltage to a level lower than a predetermined voltage.

Preferably, each of the first and second transistors is a normally-on transistor.

Preferably, the normally-on transistor is an n channel FET made of a wide band gap semiconductor.

Preferably, the switch element is an n channel MOSFET.

Preferably, the third control circuit turns the switch element on when the voltage corresponding to the difference between the voltage of the output terminal and the second voltage decreases to a level lower than the predetermined voltage, and also when the input signal is at the second logic level.

Preferably, the third voltage is set to a voltage allowing reverse conduction operation of the first or second transistor when the first or second transistor is off.

Preferably, the third voltage is set such that a reverse conduction rising voltage of the first or second transistor is within a range from −1.5V to −3.0V.

Another driver circuit according to the present invention includes a first transistor connected between a line of a first voltage and an output terminal, a second transistor connected between the output terminal and a line of a second voltage lower than the first voltage, a first control circuit including first and second power supply nodes, for supplying a voltage of the first power supply node to a control electrode of the first transistor to turn the first transistor on in response to setting of an input signal to a first logic level, and for supplying a voltage of the second power supply node to the control electrode of the first transistor to turn the first transistor off in response to setting of the input signal to a second logic level, and a second control circuit including third and fourth power supply nodes, for supplying a voltage of the fourth power supply node to a control electrode of the second transistor to turn the second transistor off in response to setting of the input signal to the first logic level, and for supplying a voltage of the third power supply node to the control electrode of the second transistor to turn the second transistor on in response to setting of the input signal to the second logic level. The third power supply node receives a third voltage higher than the second voltage, and the fourth power supply node receives a fourth voltage lower than the second voltage. The driver circuit further includes a diode having an anode receiving the third voltage and a cathode connected to the first power supply node, a first capacitor connected between the first power supply node and the output terminal, a second capacitor connected between the second power supply node and the output terminal, a switch element connected between the second and fourth power supply nodes, and a third control circuit for turning the switch element on to charge the second capacitor in response to a decrease in a voltage corresponding to a difference between a voltage of the output terminal and the second voltage to a level lower than a predetermined voltage.

Preferably, each of the first and second transistors is a normally-off transistor.

Preferably, the normally-off transistor is an n channel FET made of a wide band gap semiconductor.

Preferably, the switch element is an n channel MOSFET.

Preferably, the third control circuit turns the switch element on when the voltage corresponding to the difference between the voltage of the output terminal and the second voltage decreases to a level lower than the predetermined voltage, and also when the input signal is at the second logic level.

Advantageous Effects of Invention

In the driver circuit according to the present invention, the switch element is turned on to charge the low-voltage side electrode of the capacitor to a negative voltage in response to a decrease in the voltage corresponding to the difference between the voltage of the output terminal and the second voltage to a level lower than the predetermined voltage, and the negative voltage is supplied to the second power supply node of the first control circuit. Therefore, the negative voltage can be supplied to the first control circuit without providing a separate insulated power supply, thus attaining a driver circuit having a small size and a simple configuration.

DESCRIPTION OF EMBODIMENTS

First Embodiment

Figure 1:
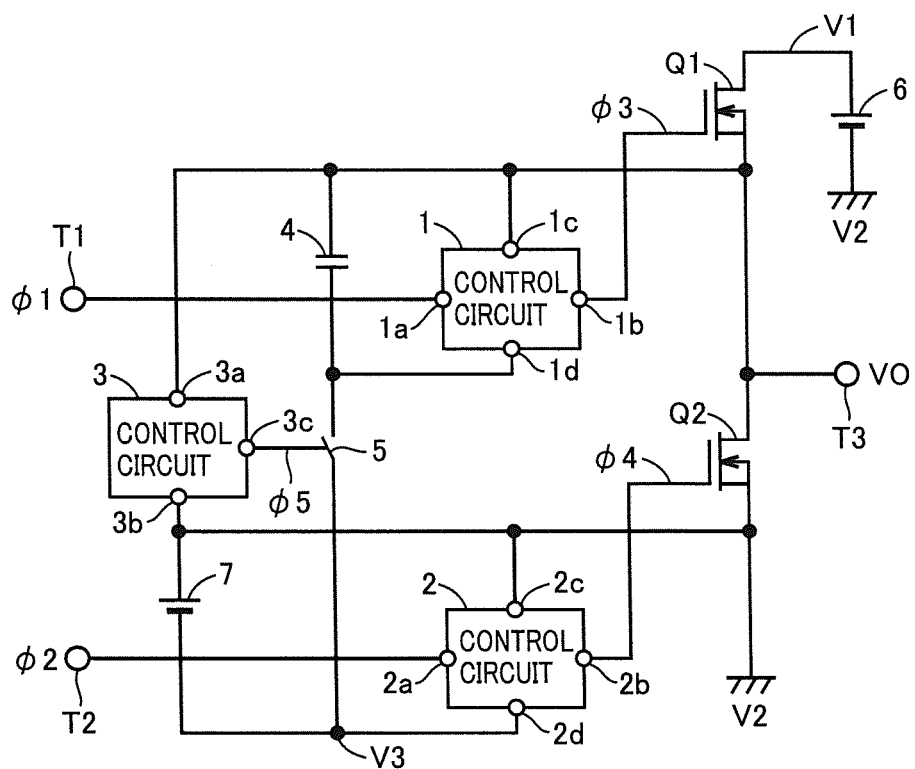
FIG. 1 is a circuit block diagram showing the configuration of a driver circuit according to a first embodiment of the present invention.

A driver circuit according to a first embodiment of the present invention includes, as shown in FIG. 1, input terminals T1 and T2, an output terminal T3, normally-on transistors Q1 and Q2, control circuits 1 to 3, a capacitor 4, a switch element 5, and power supplies 6 and 7.

Input terminal T1 receives a control signal φ1, and input terminal T2 receives a control signal φ2. Control signal φ2 is a complementary signal (inverted signal) of control signal φ1. The driver circuit outputs an "H" level (high voltage V1) to output terminal T3 in response to setting of control signals φ1 and φ2 to an "H" level and an "L" level, respectively. The driver circuit outputs an "L" level (reference voltage V2) to output terminal T3 in response to setting of control signals φ1 and φ2 to the "L" level and the "H" level, respectively.

That is, each of normally-on transistors Q1 and Q2 is an n channel FET (Field effect transistor) made of a wide band gap semiconductor. Each of normally-on transistors Q1 and Q2 has a threshold voltage Vth of about −3V, and is turned on even when a gate-source voltage is 0V.

The wide band gap semiconductor as used herein refers to a semiconductor having a band gap larger than that of silicon, particularly, a semiconductor having a band gap of not less than 2.2 eV which is about twice the band gap of silicon (1.12 eV), such as SiC, GaN, and diamond.

Transistor Q1 has a drain receiving a voltage V1 (e.g., 400V) of a positive electrode of power supply 6, a gate receiving a control signal φ3, and a source connected to output terminal T3. Power supply 6 has a negative electrode receiving reference voltage V2 (e.g., ground voltage of 0V). Transistor Q2 has a drain connected to output terminal T3, a gate receiving a control signal φ4, and a source receiving reference voltage V2. Transistors Q1 and Q2 form a half-bridge circuit.

Control circuit 1 on a high side (high-voltage side) includes an input node 1a connected to input terminal T1, an output node 1b connected to the gate of transistor Q1, a high-voltage side power supply node 1c connected to output terminal T3, and a low-voltage side power supply node 1d. Control signal φ1 is supplied to input node 1a through input terminal T1. A signal appearing on output node 1b is control signal φ3.

Control circuit 1 outputs a voltage of high-voltage side power supply node 1c to output node 1b after a lapse of a prescribed delay time td1 when control signal φ1 is set to the "H" level, and outputs a voltage of low-voltage side power supply node 1d to output node 1b when control signal φ1 is set to the "L" level. Delay time td1 is set so as to prevent transistors Q1 and Q2 from being simultaneously turned on.

Control circuit 2 on a low side (low-voltage side) includes an input node 2a connected to input terminal T2, an output node 2b connected to the gate of transistor Q2, a high-voltage side power supply node 2c receiving reference voltage V2, and a low-voltage side power supply node 2d. Control signal φ2 is supplied to input node 2a through input terminal T2. A signal appearing on output node 2b is control signal φ4.

Control circuit 2 outputs a voltage of high-voltage side power supply node 2c to output node 2b when control signal φ2 is set to the "H" level, and outputs a voltage of low-voltage side power supply node 2d to output node 2b after a lapse of a prescribed delay time td2 when control signal φ2 is set to the "L" level. Delay time td2 is set so as to prevent transistors Q1 and Q2 from being simultaneously turned on.

Capacitor 4 is connected between high-voltage side power supply node 1c and low-voltage side power supply node 1d of control circuit 1. Switch element 5 is connected between low-voltage side power supply node 1d of control circuit 1 and low-voltage side power supply node 2d of control circuit 2. Switch element 5 is on when a control signal φ5 is at the "H" level, and is off when control signal φ5 is at the "L" level. Power supply 7 has a positive electrode connected to a line of reference voltage V2, and a negative electrode connected to low-voltage side power supply node 2d of control circuit 2. The negative electrode of power supply 7 has a negative voltage V3. Negative voltage V3 is lower than threshold voltage Vth of transistors Q1 and Q2, and is about −10V, for example.

Control circuit 3 includes a detection node 3a connected to output terminal T3, a reference voltage node 3b receiving reference voltage V2, and an output node 3c connected to a control electrode of switch element 5. A signal appearing on output node 3c is control signal φ5.

Control circuit 3 sets control signal φ5 to the "L" level when a voltage VO-V2, which corresponds to the difference between a voltage VO of detection node 3a and voltage V2 of reference voltage node 3b, is higher than a prescribed reference voltage VR, and sets control signal φ5 to the "H" level when voltage VO-V2 is lower than prescribed reference voltage VR. Reference voltage VR is a positive voltage of about 0V.

Figure 2:
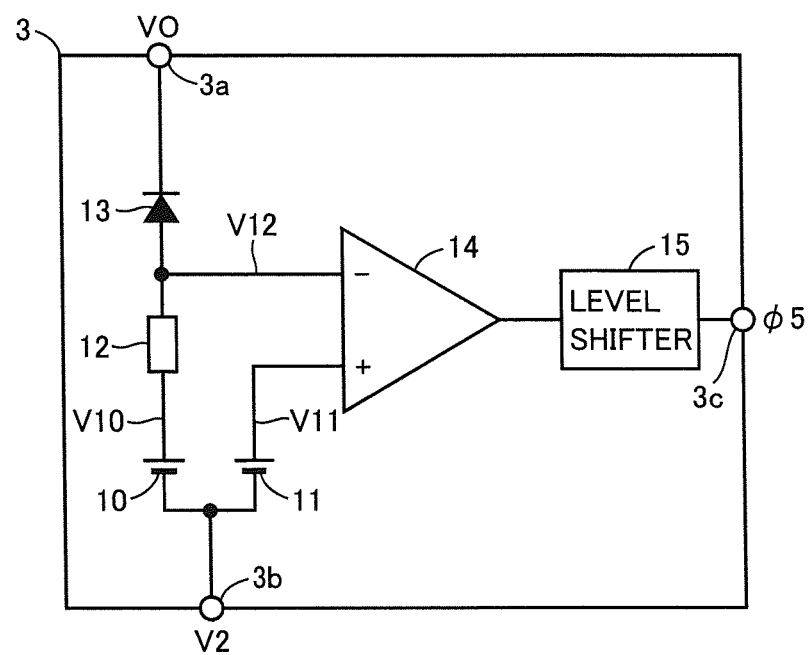
FIG. 2 is a circuit block diagram showing the configuration of a control circuit 3 shown in FIG. 1.
Figure 3:
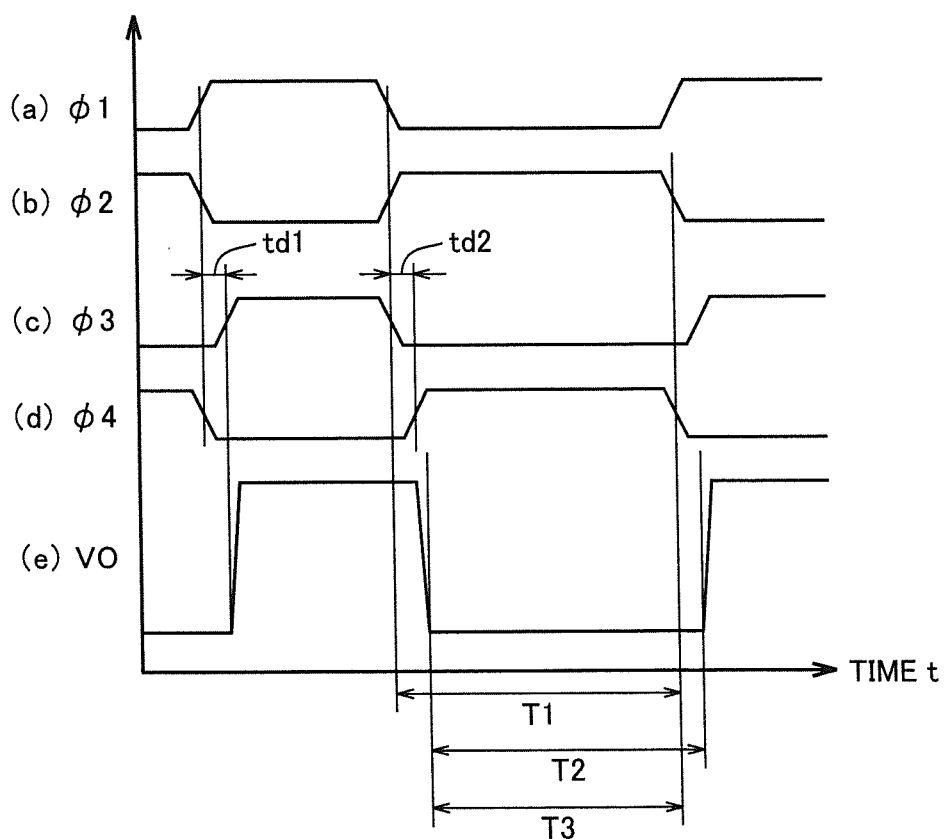
FIG. 3 is a time chart illustrating the operation of the driver circuit shown in FIG. 1.

FIG. 2 is a circuit block diagram showing the configuration of control circuit 3. In FIG. 2, control circuit 3 includes power supplies 10 and 11, a resistive element 12, a diode 13, a comparator 14, and a level shifter 15. Each of power supplies 10 and 11 has a negative electrode connected to reference voltage node 3b. Power supply 10 has a positive electrode connected to detection node 3a through resistive element 12 and diode 13.

Comparator 14 has a positive terminal receiving a voltage V11 of a positive electrode of power supply 11, and a negative terminal receiving a voltage V12 of an anode of diode 13. Comparator 14 outputs an "H" level signal when V11>V12 is satisfied, and outputs an "L" level signal when V11<V12 is satisfied. Level shifter 15 shifts the level of the signal output from comparator 14 by a prescribed voltage, and outputs the resultant signal to output node 3c. A signal appearing on output node 3c is control signal φ5.

A voltage V10 of power supply 10 is set to a voltage higher than voltage V11 of power supply 11. A forward voltage of diode 13 is represented as VF. When VO is higher than V10-VF, diode 13 is turned off, V12=V10 is satisfied, and control signal φ5 is switched to the "L" level. When VO is lower than V10-VF, diode 13 is turned on, V12<V11<V10 is satisfied, and control signal φ5 is switched to the "H" level. It is noted that V10-VF is set as close to 0V as possible. Diode 13 may be replaced with a plurality of diodes connected in series in a forward direction, so as to prevent a breakdown of diode 13.

As such, switch element 5 is turned on when voltage VO of output terminal T3 becomes substantially equal to reference voltage V2, and is turned off when output voltage VO becomes higher than reference voltage V2 by a prescribed voltage.

FIG. 3(a) to (e) is a time chart illustrating the operation of the driver circuit. In FIG. 3(a) to (e), control signals φ1 and φ2 are complementary to each other. This is to prevent transistors Q1 and Q2 from being simultaneously turned on. If transistors Q1 and Q2 are simultaneously turned on, a flow-through current flows from the positive electrode of power supply 6 to the line of reference voltage V2 through transistors Q1 and Q2, thereby breaking down transistors Q1 and Q2.

However, when the delay time of control signal φ1 and the delay time of control signal φ2 are not identical to each other, or depending on the state of a load, the complementary relation between control signals φ1 and φ2 is not enough. Thus, control signal φ3 is generated by delaying a leading edge of control signal φ1 by a prescribed time td1, and control signal φ4 is generated by delaying a leading edge of control signal φ2 by a prescribed time td2.

Consequently, output voltage VO operates with a delay relative to control signals φ1 and φ2. If switch element 5 is turned on during a time T1 when control signal φ2 is at the "H" level, a voltage corresponding to the difference between high voltage V1 and negative voltage V3 is applied to capacitor 4 and control circuit 1, thereby breaking down the circuit. In contrast, the circuit is not broken down in the first embodiment, because switch element 5 is turned on during a time T2 when output voltage VO is at the "L" level. A time T3 will be described later.

When switch element 5 is on, transistor Q1 is off and transistor Q2 is on. Thus, the positive electrode of power supply 7 is connected to a high-voltage side electrode of capacitor 4 through transistor Q2 while the negative electrode of power supply 7 is connected to a low-voltage side electrode of capacitor 4 through switch element 5, thereby charging capacitor 4. At this time, as a negative gate voltage for maintaining transistor Q1 in an off state, negative voltage V3 of power supply 7 is input to the gate of transistor Q1 through switch element 5 and low-voltage side power supply node 1d.

Then, transistors Q1, Q2 and switch element 5 are controlled based on control signals φ1 and φ2, such that transistor Q1 is turned on while transistor Q2 and switch element 5 are turned off. Since transistor Q1 is a normally-on transistor, the source voltage is applied to the gate as the voltage of high-voltage side power supply node 1c, thereby turning transistor Q1 on. When transistor Q1 is turned on, output voltage VO increases to a level close to voltage V1 of the positive electrode of power supply 6.

At this time, since transistor Q2 and switch element 5 are off, capacitor 4 is disconnected from power supply 7 and functions as a power supply of control circuit 1. The high-voltage side electrode of capacitor 4 has output voltage VO, and the low-voltage side electrode of capacitor 4 has a voltage lower than output voltage VO. Thus, a voltage lower than output voltage VO can be supplied to the gate of transistor Q1. This can ensure that transistor Q1 is turned off at subsequent switching timing.

As described above, in this first embodiment, negative voltage V3 can be supplied to control circuit 1 on the high side without providing a separate insulated power supply, thus attaining a size reduction and a simplified configuration of the device. Furthermore, the use of transistors Q1 and Q2 made of a wide band gap semiconductor allows for a lowered ON-resistance value of the switching element and an increased switching speed, thus attaining an increased speed and reduced power consumption of the driver circuit.

[First Modification]

Figure 4:
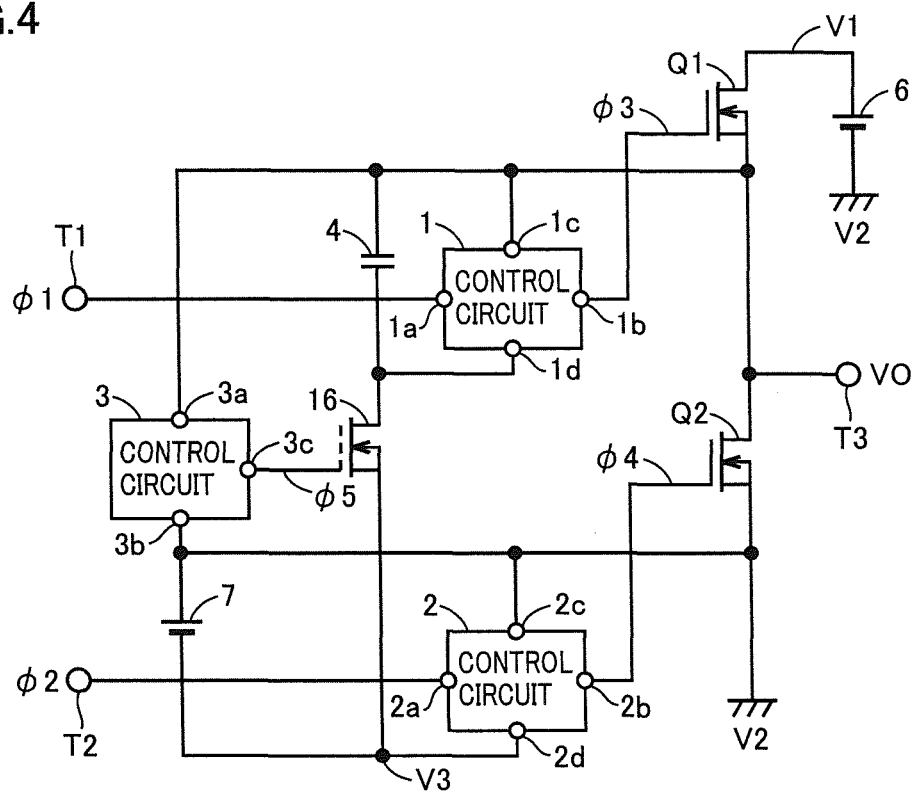
FIG. 4 is a circuit block diagram showing a first modification of the first embodiment.

FIG. 4 is a circuit block diagram showing a first modification of the first embodiment, which is compared to FIG. 1. Referring to FIG. 4, the first modification is different from the first embodiment in that switch element 5 is replaced with an n channel MOSFET 16. In other words, switch element 5 is formed of n channel MOSFET 16. MOSFET 16 has a drain connected to low-voltage side power supply node 1d of control circuit 1, a gate receiving control signal φ5, and a source receiving negative voltage V3.

MOSFET 16 is turned on when control signal φ5 is set to the "H" level, and MOSFET 16 is turned off when control signal φ5 is set to the "L" level. Since the source of MOSFET 16 is connected to negative voltage V3 lower than reference voltage V2 (0V), the "H" level of control signal φ5 is set to a voltage higher than a voltage obtained by adding a threshold voltage of MOSFET 16 to negative voltage V3. The "L" level of control signal φ5 is set to a voltage lower than the voltage obtained by adding the threshold voltage of MOSFET 16 to negative voltage V3.

In this first modification where switch element 5 is replaced with n channel MOSFET 16, higher speed switching is enabled to thereby increase a response speed of the driver circuit.

Switch element 5 can of course be formed of a bipolar transistor, or of an element made of a wide band gap semiconductor.

[Second Modification]

Figure 5:
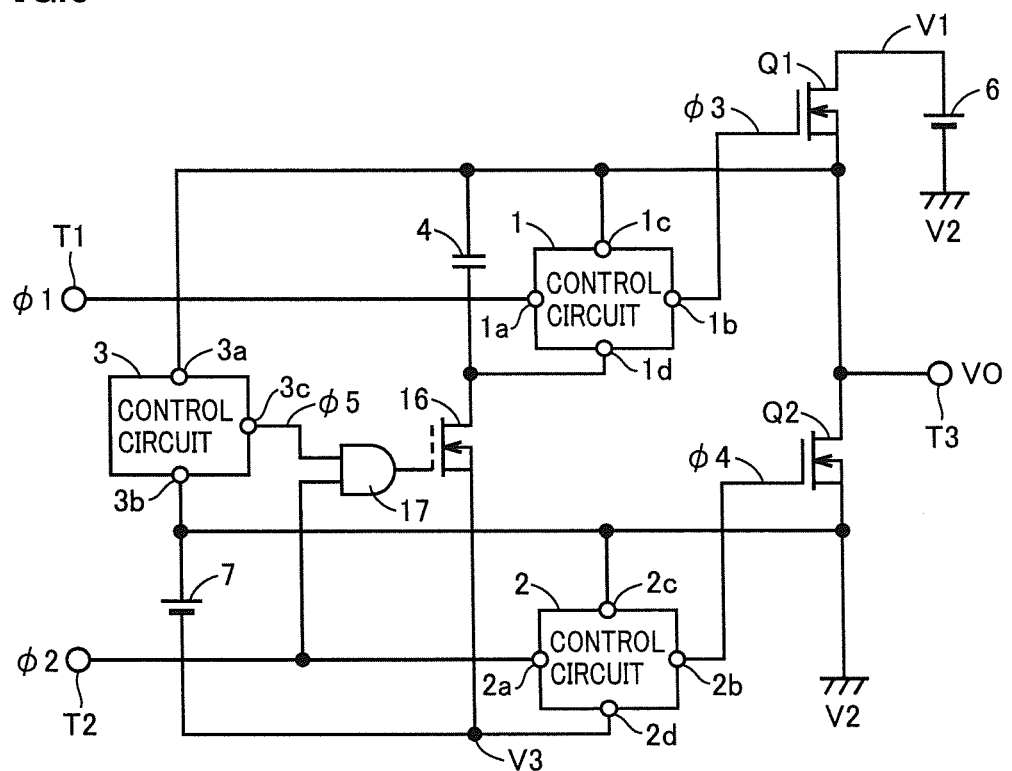
FIG. 5 is a circuit block diagram showing a second modification of the first embodiment.

FIG. 5 is a circuit block diagram showing a second modification of the first embodiment, which is compared to FIG. 4. Referring to FIG. 5, the second modification is different from the first modification in that an AND gate 17 is added. AND gate 17 supplies an AND signal of control signals φ5 and φ2 to the gate of MOSFET 16. Accordingly, as shown in FIG. 3(a) to (e), MOSFET 16 is turned on during time T3 when output voltage VO is about 0V and control signal φ2 is at the "H" level. This can ensure that MOSFET 16 is prevented from being turned on when output voltage VO is high.

Second Embodiment

A driver circuit in a second embodiment has a configuration the same as that of the driver circuit in FIG. 1. In this second embodiment, the value of negative voltage V3 in FIG. 1 is examined. Each of normally-on transistors Q1 and Q2 in FIG. 1 is a normally-on n channel FET.

Figure 6:
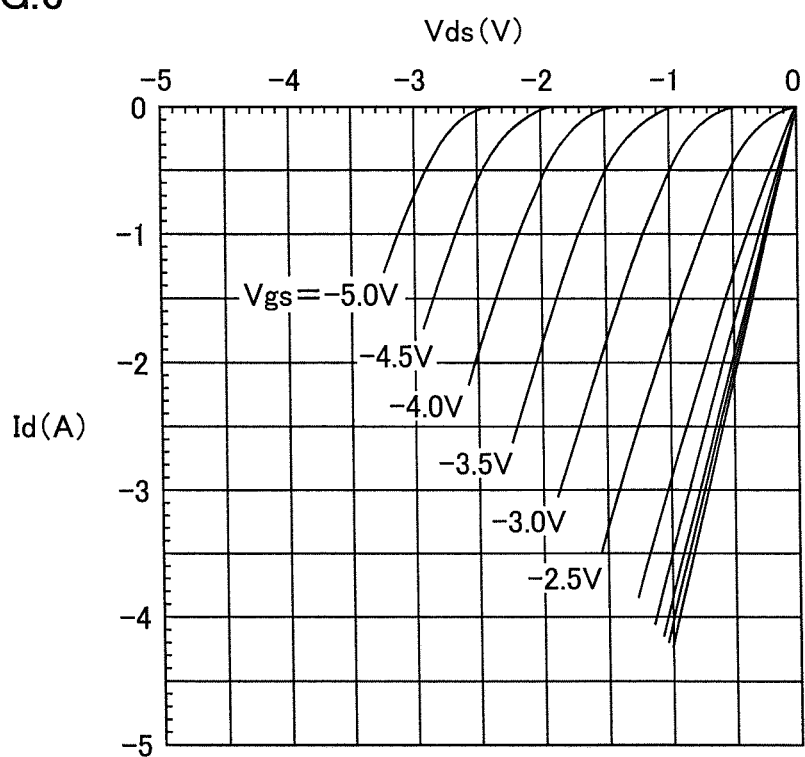
FIG. 6 is a diagram illustrating a driver circuit according to a second embodiment of the present invention.

FIG. 6 is a diagram illustrating the dependence of a reverse conducting characteristic of a normally-on n channel FET on a gate voltage Vgs. The FET used had a threshold voltage Vth of −2.5V. The reverse conducting characteristic of an FET refers to a characteristic indicating relation between a negative voltage Vds applied between a drain and a source of the FET and a current Id flowing between the drain and the source, when prescribed gate voltage Vgs is applied between a gate and the source of the FET. FIG. 6 shows variation in the characteristic when Vgs is increased in increments of +0.5V from −5V from the left.

In FIG. 6 where threshold voltage Vth is about −2.5V, when gate voltage Vgs applied in an off state is −5.0V, −4.5V and −4.0V, a reverse conduction rising voltage in a reverse conduction state is −2.5V, −2.0V and −1.5V, respectively. In the second embodiment, the value of negative voltage V3 is adjusted such that the reverse conduction rising voltage of transistors Q1 and Q2 is within a range from −1.5V to −3.0V. That is, negative voltage V3 is set within a range from −5.0V to −4.0V such that gate voltage Vgs supplied to transistors Q1 and Q2 through control circuits 1 and 2 is within a range from −5.0V to −4.0V. As such, reverse conduction operation of transistors Q1 and Q2 is enabled at a reverse conduction rising voltage having a small absolute value within the range from −1.5V to −3.0V.

An FED usually used in an inverter circuit has a forward voltage of about 1.5V to 3.0V. Therefore, the second embodiment can ensure that reverse conduction operation of transistors Q1 and Q2 is enabled without providing an FWD which usually needs to be connected in parallel to a switching element for inverter.

Third Embodiment

Figure 7:
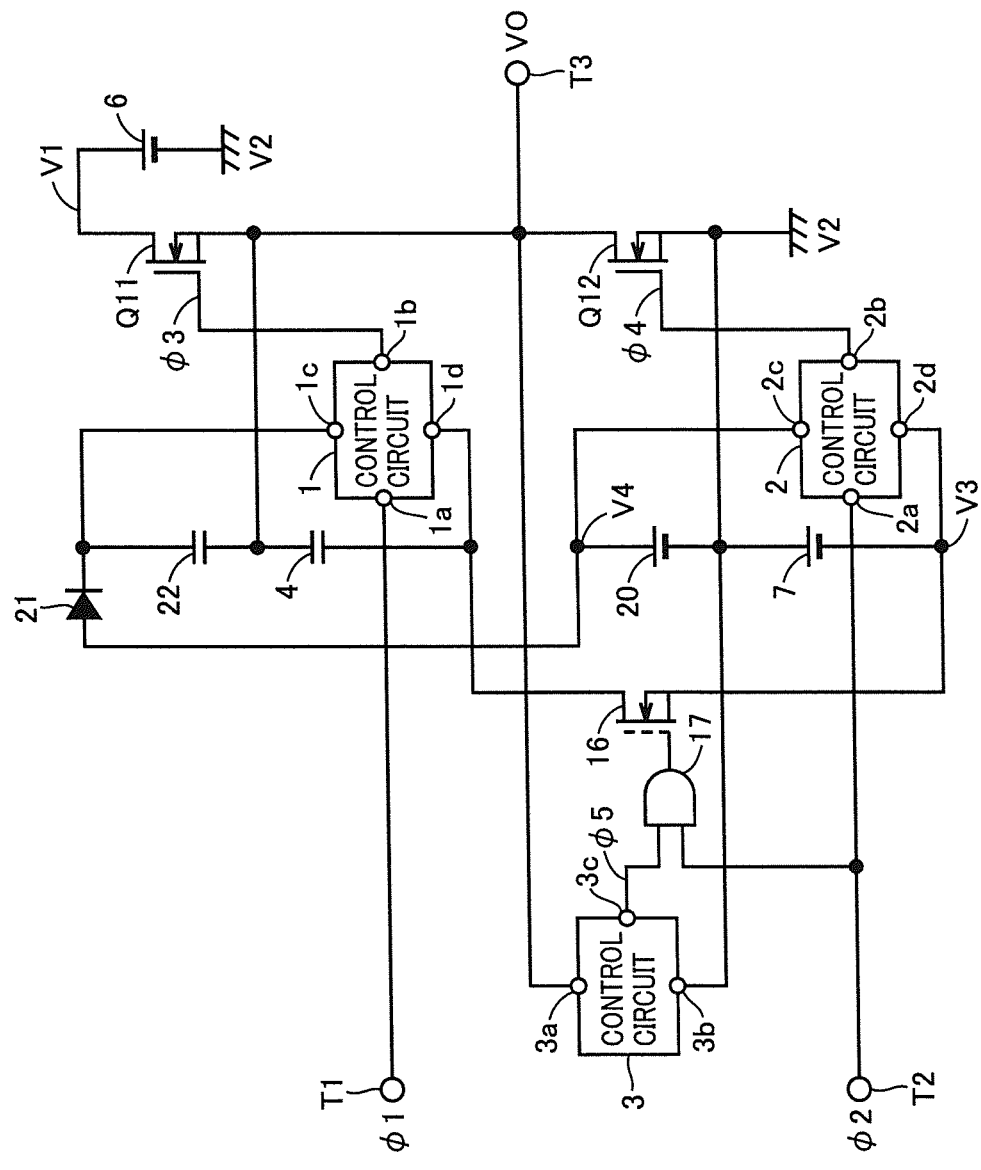
FIG. 7 is a circuit block diagram showing the configuration of a driver circuit according to a third embodiment of the present invention.

FIG. 7 is a circuit block diagram showing the configuration of a driver circuit according to a third embodiment of the present invention, which is compared to FIG. 5. Referring to FIG. 7, this driver circuit is different from the driver circuit in FIG. 5 in that normally-on transistors Q1 and Q2 are replaced with normally-off transistors Q11 and Q12 made of a wide band gap semiconductor, respectively, and that a power supply 20, a diode 21 and a capacitor 22 are added.

Each of normally-off transistors Q11 and Q12 is an n channel FET having a threshold voltage of about 2V. In order to turn transistors Q11 and Q12 on, the voltage of high-voltage side power supply nodes 1c and 2c of control circuits 1 and 2 needs to be higher than the a threshold voltage (2V) of transistors Q11 and Q12. This is why power supply 20, diode 21 and capacitor 22 are added.

Power supply 20 has a negative electrode connected to the line of reference voltage V2. Power supply 20 has a positive electrode directly connected to high-voltage side power supply node 2c of control circuit 2, while being connected to high-voltage side power supply node 1c of control circuit 1 through diode 21. Capacitor 22 is connected between a cathode of diode 21 and output terminal T3. A voltage V4 between the positive and negative electrodes of power supply 20 is set to a voltage (e.g., +10V) higher than the threshold voltage (2V) of transistors Q11 and Q12. Diode 21 and capacitor 22 form a bootstrap circuit.

When control signals φ1 and φ2 are at the "L" level and the "H" level, respectively, control signals φ3 and φ4 are set to the "L" level (VO+V3) and the "H" level (V4) by control circuits 1 and 2, respectively. As such, transistor Q11 is turned off while transistor Q12 is turned on, and output voltage VO becomes reference voltage V2, thereby turning MOSFET 16 on.

At this time, the negative electrode of power supply 7 is connected to the low-voltage side electrode of capacitor 4 through MOSFET 16 while the positive electrode of power supply 7 is connected to the high-voltage side electrode of capacitor 4 through transistor Q12, thereby charging capacitor 4 to negative voltage V3. The positive electrode of power supply 20 is connected to the high-voltage side electrode of capacitor 22 through diode 21 while the negative electrode of power supply 20 is connected to the low-voltage side electrode of capacitor 22 through transistor Q12, thereby charging capacitor 22 to positive voltage V4.

Then, when control signals φ1 and φ2 set to the "H" level and the "L" level, respectively, control signals φ3 and φ4 are set to the "H" level (VO+V4) and the "L" level (V3) by control circuits 1 and 2, respectively. As such, transistor Q11 is turned on while transistor Q12 is turned off, and output voltage VO becomes high voltage V1.

In this third embodiment, negative voltage V3 can be supplied to control circuit 1 on the high side without providing a separate insulated power supply, thus attaining a size reduction and a simplified configuration of the device.

The first to third embodiments and the modifications described above can of course be combined as appropriate.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1, 2, 3 control circuit; 4, 22 capacitor; 5 switch element; 6, 7, 10, 11, 20 power supply; 12 resistive element; 13, 21 diode; 14 comparator; 15 level shifter; 16 n channel MOSFET; 17 AND gate; Q1, Q2 normally-on transistor; Q11, Q12 normally-off transistor.

The invention claimed is:

1. A driver circuit comprising:
a first transistor connected between a line of a first voltage and an output terminal;
a second transistor connected between said output terminal and a line of a second voltage lower than said first voltage;
a first control circuit including first and second power supply nodes, for supplying a voltage of said first power supply node to a control electrode of said first transistor to turn said first transistor on in response to setting of an input signal to a first logic level, and for supplying a voltage of said second power supply node to the control electrode of said first transistor to turn said first transistor off in response to setting of said input signal to a second logic level; and
a second control circuit including third and fourth power supply nodes, for supplying a voltage of said fourth power supply node to a control electrode of said second transistor to turn said second transistor off in response to setting of said input signal to said first logic level, and for supplying a voltage of said third power supply node to the control electrode of said second transistor to turn said second transistor on in response to setting of said input signal to said second logic level;
said first power supply node being connected to said output terminal,
said third power supply node receiving said second voltage,
said fourth power supply node receiving a third voltage lower than said second voltage,
said driver circuit further comprising:
a capacitor connected between said first and second power supply nodes;
a switch element connected between said second and fourth power supply nodes; and
a third control circuit for turning said switch element on to charge said capacitor in response to a decrease in a voltage corresponding to a difference between a voltage of said output terminal and said second voltage to a level lower than a predetermined voltage.

2. The driver circuit according to claim 1, wherein each of said first and second transistors is a normally-on transistor.

3. The driver circuit according to claim 2, wherein said normally-on transistor is an n channel FET made of a wide band gap semiconductor.

4. The driver circuit according to claim 1, wherein said switch element is an n channel MOSFET.

5. The driver circuit according to claim 1, wherein said third control circuit turns said switch element on when the voltage corresponding to the difference between the voltage of said output terminal and said second voltage decreases to a level lower than said predetermined voltage, and also when said input signal is at said second logic level.

6. The driver circuit according to claim 1, wherein said third voltage is set to a voltage allowing reverse conduction operation of said first or second transistor when said first or second transistor is off.

7. The driver circuit according to claim 6, wherein said third voltage is set such that a reverse conduction rising voltage of said first or second transistor is within a range from −1.5V to −3.0V.

8. A driver circuit comprising:
a first transistor connected between a line of a first voltage and an output terminal;
a second transistor connected between said output terminal and a line of a second voltage lower than said first voltage;
a first control circuit including first and second power supply nodes, for supplying a voltage of said first power supply node to a control electrode of said first transistor to turn said first transistor on in response to setting of an input signal to a first logic level, and for supplying a voltage of said second power supply node to the control electrode of said first transistor to turn said first transistor off in response to setting of said input signal to a second logic level; and
a second control circuit including third and fourth power supply nodes, for supplying a voltage of said fourth power supply node to a control electrode of said second transistor to turn said second transistor off in response to setting of said input signal to said first logic level, and for supplying a voltage of said third power supply node to the control electrode of said second transistor to turn said second transistor on in response to setting of said input signal to said second logic level;
said third power supply node receiving a third voltage higher than said second voltage,
said fourth power supply node receiving a fourth voltage lower than said second voltage,
said driver circuit further comprising:

a diode having an anode receiving said third voltage and a cathode connected to said first power supply node;
a first capacitor connected between said first power supply node and said output terminal;
a second capacitor connected between said second power supply node and said output terminal;
a switch element connected between said second and fourth power supply nodes; and
a third control circuit for turning said switch element on to charge said second capacitor in response to a decrease in a voltage corresponding to a difference between a voltage of said output terminal and said second voltage to a level lower than a predetermined voltage.

9. The driver circuit according to claim 8, wherein
each of said first and second transistors is a normally-off transistor.

10. The driver circuit according to claim 9, wherein
said normally-off transistor is an n channel FET made of a wide band gap semiconductor.

11. The driver circuit according to claim 8, wherein
said switch element is an n channel MOSFET.

12. The driver circuit according to claim 8, wherein
said third control circuit turns said switch element on when the voltage corresponding to the difference between the voltage of said output terminal and said second voltage decreases to a level lower than said predetermined voltage, and also when said input signal is at said second logic level.

* * * * *